United States Patent
Maerten et al.

(10) Patent No.: US 10,650,107 B2
(45) Date of Patent: *May 12, 2020

(54) THREE-DIMENSIONAL SUBSURFACE FORMATION EVALUATION USING PROJECTION-BASED AREA OPERATIONS

(71) Applicant: Schlumberger Technology Corporation, Sugar Land, TX (US)

(72) Inventors: Frantz Maerten, Montpellier (FR); Romain Plateaux, Leeds (GB); Jean-Pierre Joonnekindt, Montpellier (FR); Stephen Grenfell, Leeds (GB); Mustapha Lejri, Leeds (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 382 days.

This patent is subject to a terminal disclaimer.

(21) Appl. No.: 15/150,244

(22) Filed: May 9, 2016

(65) Prior Publication Data

US 2017/0321523 A1 Nov. 9, 2017

(51) Int. Cl.
 *G06F 17/50* (2006.01)
 *E21B 43/26* (2006.01)

(52) U.S. Cl.
 CPC ...... *G06F 17/5009* (2013.01); *G06F 17/5018* (2013.01); *E21B 43/26* (2013.01)

(58) Field of Classification Search
 CPC .............................. E21B 43/00; G06F 17/5009
 See application file for complete search history.

(56) References Cited

U.S. PATENT DOCUMENTS

| | | | |
|---|---|---|---|
| 8,166,042 B1* | 4/2012 | Praun | G06F 17/30327 707/743 |
| 8,803,878 B2 | 8/2014 | Andersen et al. | |
| 8,898,046 B2 | 11/2014 | Moos et al. | |
| 9,607,007 B2 | 3/2017 | Bakke et al. | |
| 2010/0191511 A1 | 7/2010 | Hsu et al. | |
| 2010/0211370 A1 | 8/2010 | Maliassov | |
| 2011/0087472 A1 | 4/2011 | den Boer et al. | |
| 2011/0251830 A1* | 10/2011 | Hilliard | G06F 17/5018 703/1 |
| 2011/0257944 A1 | 10/2011 | Du et al. | |
| 2012/0116740 A1 | 5/2012 | Fourno et al. | |
| 2012/0303342 A1* | 11/2012 | Hazlett | E21B 43/00 703/2 |
| 2012/0310613 A1* | 12/2012 | Moos | E21B 43/26 703/10 |

(Continued)

FOREIGN PATENT DOCUMENTS

WO 2015/168417 A1 11/2015

OTHER PUBLICATIONS

Imma Boada and Isabel Navazo, The Hybrid Octree: Towards the Definition of a Multiresolution Hybrid Framework, Springer-Verlag Berlin Heidelberg 2002, ICCS 2002, LNCS 2330, pp. 121-130 (Year: 2002).*

(Continued)

*Primary Examiner* — Rehana Perveen
*Assistant Examiner* — Chuen-Meei Gan

(57) ABSTRACT

A method, apparatus, and program product utilize projection-based area operations to accelerate the determination of subsurface structure parameters for subsurface structures such as fractures, faults and horizons in a subsurface formation.

17 Claims, 13 Drawing Sheets

(56) References Cited

U.S. PATENT DOCUMENTS

| | | | |
|---|---|---|---|
| 2013/0112407 A1* | 5/2013 | Cheng | G01V 11/00 |
| | | | 166/250.15 |
| 2013/0138406 A1 | 5/2013 | Khvoenkova et al. | |
| 2014/0058713 A1 | 2/2014 | Thachaparambil et al. | |
| 2014/0299315 A1 | 10/2014 | Chuprakov et al. | |
| 2014/0305638 A1 | 10/2014 | Kresse et al. | |
| 2014/0358510 A1 | 12/2014 | Sarkar et al. | |
| 2014/0372094 A1 | 12/2014 | Holland et al. | |
| 2014/0372095 A1 | 12/2014 | Van Der Zee et al. | |
| 2015/0066465 A1 | 3/2015 | Deschamps et al. | |
| 2016/0003008 A1 | 1/2016 | Uribe et al. | |
| 2016/0108705 A1 | 4/2016 | Maxwell et al. | |
| 2017/0316128 A1 | 11/2017 | Huang et al. | |
| 2017/0321543 A1* | 11/2017 | Plateaux | E21B 49/00 |
| 2017/0323477 A1* | 11/2017 | Plateaux | E21B 41/0092 |

OTHER PUBLICATIONS

Charles Frohman, The Full Pythagorean Theorem, Jan. 1, 2010, p. 1-10 (Year: 2010).*

M. Mauldon and W. Dershowitz, A Multi-Dimensional System of Fracture Abundance Measures, Geological Society of America Annual Meeting Reno, Nevada, Nov. 2000, p. 1-28 (Year: 2000).*

Thomas Daniel Seers, Image Based Characterisation of Structural Heterogeneity within Clastic Reservoir Analogues, Thesis for School of Earth, Atmospheric and Environmental Sciences, University of Manchester, p. 1-248. (Year: 2015).*

Sergei Winitzki, Ph.D., Linear Algebra via Exterior Products, ISBN 978-1-4092-9496-2, published by lulu.com, Version 1.2. Last change: Jan. 4, 2010 (Year: 2010).*

Paluszny, A., S. K. Matthäi, and M. Hohmeyer. "Hybrid finite element-finite volume discretization of complex geologic structures and a new simulation workflow demonstrated on fractured rocks." Geofluids 7, No. 2 (2007): 186-208. (Year: 2007).*

Zhou, H. W., and H. Xie. "Direct estimation of the fractal dimensions of a fracture surface of rock." Surface Review and Letters 10, No. 05 (2003): 751-762. (Year: 2003).*

Paluszny, A., S. K. Matthäi, and M. Hohmeyer. "Hybrid finite element—finite volume discretization of complex geologic structures and a new simulation workflow demonstrated on fractured rocks." Geofluids 7, No. 2 (2007): 186-208. (Year: 2007).*

Welch, et al., "A dynamic model for fault nucleation and propagation in a mechanically layered section," Tectonophysics, 2009, vol. 474(3-4), pp. 473-492.

International Search Report and Written Opinion for the cross referenced International patent application PCT/US2017/026738 dated Jul. 21, 2017.

International Search Report and Written Opinion for the cross referenced International patent application PCT/US2017/026739 dated Jul. 17, 2017.

Office Action for the cross referenced patent application for U.S. Appl. No. 15/150,268 dated Mar. 2, 2018.

Bai, et al., "Mechanical prediction of fracture aperture in layered rocks," Journal of Geophysical Research: Solid Earth 105, No. B1, 2000, pp. 707-721.

Boume, et al., "Predictive modelling of naturally fractured reservoirs using geomechanics and flow simulation," In Abu Dhabi International Petroleum Exhibition and Conference, Society of Petroleum Engineers, 2000.

Mustapha, "An efficient method for discretizing 3D fractured media for subsurface flow and transport simulations," International Journal for Numerical Methods in Fluids, Int. J. Numer. Meth. Fluids 2011; 67; 651-670, Published online 212 Jul. 2010 in Wiley Online Library (wileyonlinelibrary.com, 2010.

Plateaux, "Proposal: Moving the 3-D fracture intensity calculator to the cloud: a new user experience for software development," 2018 retrieved at http://www.it.uu.se/edu/course/homepage/projektTDB/ht16/projects/TDBproject14.

Wang, "Stereological Interpretation of rock fracture traces on borehole walls and other cylindrical surfaces," PhD dias, Virginia Tech 2005.

Zhou, et al., "Direct estimation of the fractal dimensions of a fracture surface of rock," Surface Review and Letters 10, No. 5, 2003, pp. 751-762.

International Preliminary Report on Patentability for the cross referenced International patent application PCT/US2017/026739 dated Nov. 22, 2018.

Office Action for the cross referenced U.S. Appl. No. 15/150,260 dated Aug. 2, 2018.

Final Office Action for the cross referenced U.S. Appl. No. 15/150,260 dated Dec. 11, 2018.

Office Action for the cross referenced U.S. Appl. No. 15/150,260 dated Apr. 12, 2019.

Office Action for the cross referenced U.S. Appl. No. 15/150,260 dated Aug. 7, 2019.

Extended Search Report for the European patent application 17796531.6 dated Oct. 28, 2019.

Extended Search Report for the European patent application 17796530.8 dated Dec. 17, 2019.

* cited by examiner

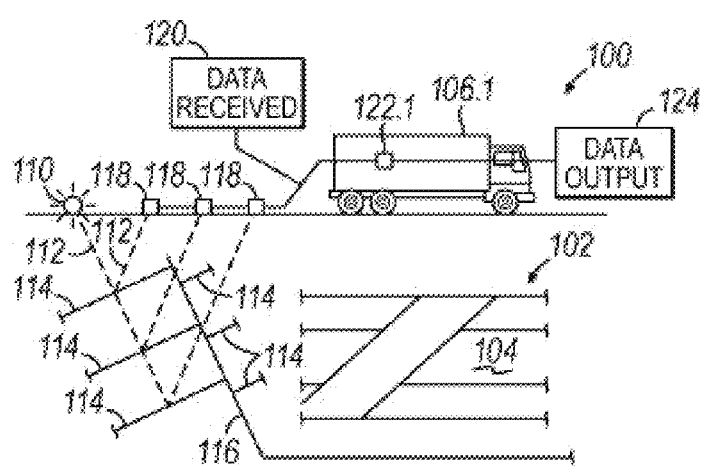
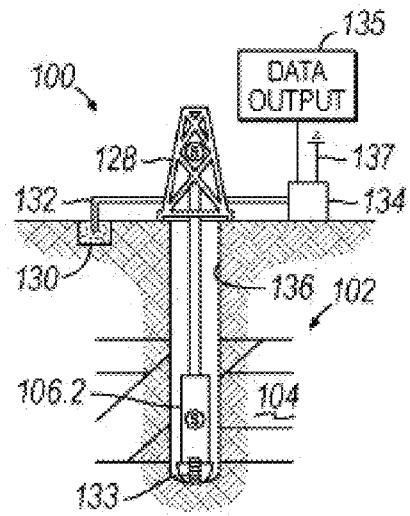
FIG. 2A  FIG. 2B
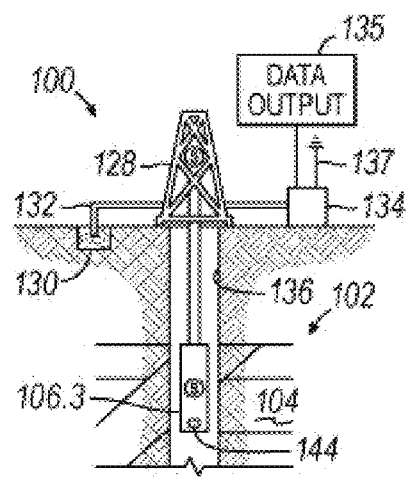
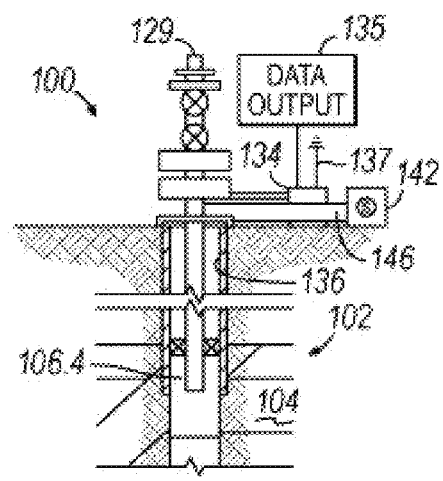
FIG. 2C  FIG. 2D

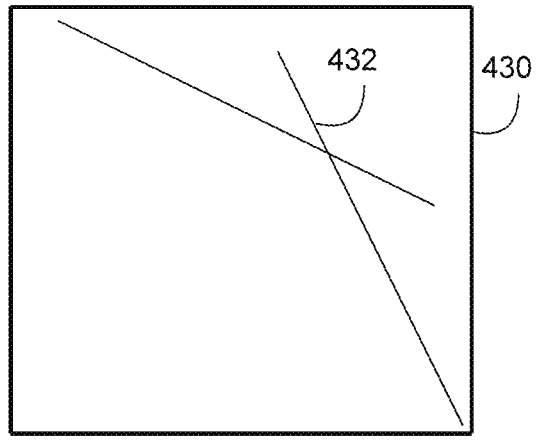
FIG. 7A
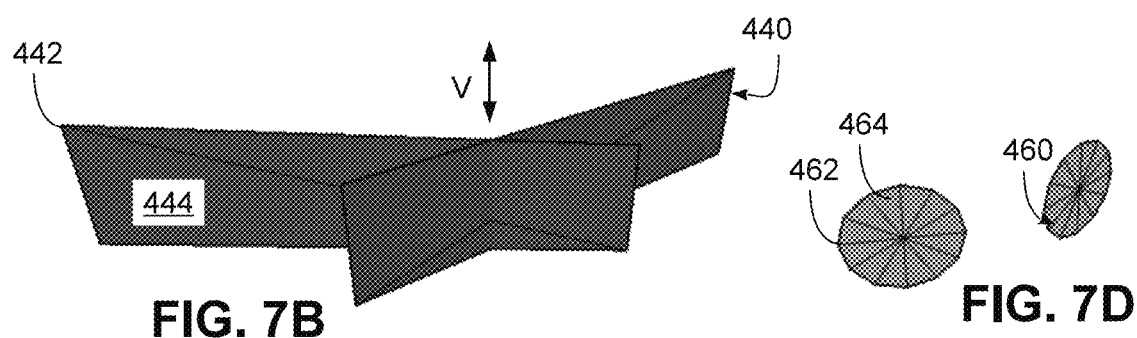
FIG. 7B
FIG. 7D
FIG. 7C

THREE-DIMENSIONAL SUBSURFACE FORMATION EVALUATION USING PROJECTION-BASED AREA OPERATIONS

BACKGROUND

Reservoir modeling and simulation are commonly used in the oil & gas industry to model the structure and/or properties of a subsurface formation, e.g., of the type containing recoverable hydrocarbons, as well as to model the flow of fluids such as recoverable hydrocarbons throughout such a formation. Reservoir modeling and simulation may be used during various phases of exploration and production, including, for example, to attempt to predict the location, quantity and/or value of recoverable hydrocarbons, to plan the development of wells for cost-effectively extracting hydrocarbons from the subsurface formation, and to guide future and/or ongoing production and development decisions.

Many subsurface formations include some degree of fracturing, i.e., the presence of faults, joints, cracks and other discontinuities that separate rock within the subsurface formation. Fractures generally have greater permeability and porosity than solid rock, so accounting for the effects of fractures is generally desirable for accurate fluid flow simulation. In this regard, a number of different fracture abundance measures have been proposed to represent the relative amount of fracturing within a subsurface formation, including, for example, fracture density, fracture intensity, fracture porosity, etc. Some conventional approaches, for example, calculate a fracture density as a $P_{10}$ value (number of fractures per unit length along a scanline) from wells. In addition, in some approaches a $P_{32}$ value (sum of fracture area per unit volume) is inferred from the $P_{10}$ value by making an assumption that fractures entirely intersect a borehole as well as corrected from borehole deviation and then using a statistical method to interpolate $P_{32}$ in a three-dimensional (3D) grid as an input for Discrete Fracture Network (DFN) generation.

The $P_{32}$ value is desirable in many applications because fracture size is accounted for in the value and does not depend on borehole trajectory. However, accurate fracture sizes within a borehole are generally difficult to obtain from borehole images and core logging, and generally result in the calculation of only a "relative" $P_{32}$ measurement from wells. Furthermore, interpolation of this measurement generally creates large uncertainties within the 3D grid that generally cannot be easily quantified.

Therefore, a need exists in the art for improved evaluation of $P_{32}$ and other fracture abundance parameters, and in particular, an improved evaluation having greater accuracy and/or greater computational efficiency than convention approaches.

SUMMARY

The embodiments disclosed herein provide a method, apparatus, and program product that evaluate a subsurface formation by defining a subsurface structure within multiple cells of a three-dimensional model of the subsurface formation using multiple geometric primitives, determining an area of the geometric primitives within at least a subset of the cells by summing areas of individual geometric primitives within each of the subset of cells, including determining an area of a first geometric primitive among the geometric primitives within a first cell in the subset of cells by projecting the first geometric primitive onto each of first, second and third orthogonal planes respectively aligned with faces of the first cell to define respective first, second and third projections and calculating areas of each of the first, second and third projections, and determining a subsurface structure parameter for the subsurface structure from the determined area of the geometric primitives.

In some embodiments, each of the geometric primitives is a triangular element, and in some embodiments, determining the area of the first geometric primitive further includes squaring the areas of each of the first, second and third projections, summing the squared areas and determining a square root of the summed squared areas.

Further, in some embodiments, the subsurface structure is a fracture network, a fault or a horizon, and in some embodiments, defining the subsurface structure includes defining a fracture network, and determining the subsurface structure parameter from the determined area of the geometric primitives includes determining a fracture abundance parameter for the fracture network from the determined area of the geometric primitives. Some embodiments also include determining areas for one or more additional geometric primitives at least partially disposed within the first cell, where determining the fracture abundance parameter includes determining a fracture density within the first cell by dividing a sum of the determined areas for all geometric primitives at least partially disposed within the first cell by a volume of the first cell.

In addition, in some embodiments, determining the area of the first geometric primitive further includes clipping the first geometric primitive in response to determining that the first geometric primitive is partially disposed within the first cell, and in some embodiments, determining the area of the geometric primitives within the subset of the cells further includes organizing the geometric primitives within a spatially-organized data structure and accessing the spatially-organized data structure when summing areas of individual geometric primitives within each of the subset of cells to determine which of the geometric primitives are at least partially within each of the subset of cells. In some embodiments, the spatially-organized data structure includes an octree.

In some embodiments, defining the fracture network within the cells includes generating the geometric primitives and creating an observation grid bounding a volume around the geometric primitives. In addition, in some embodiments, determining the fracture abundance parameter includes determining a fracture density within each of the subset of cells by dividing the summed areas of individual geometric primitives therein by a volume thereof. In some embodiments, determining the fracture abundance parameter includes determining a directly-calculated $P_{32}$ fracture density within each of the subset of cells by dividing the summed areas of individual geometric primitives therein by a volume thereof.

Some embodiments also include running a fluid flow simulation using the determined fracture abundance parameter to estimate fluid flow through the fracture network. Further, some embodiments also include performing an oilfield operation based upon a result of the fluid flow simulation.

Some embodiments may also include an apparatus including at least one processing unit and program code configured upon execution by the at least one processing unit to evaluate a subsurface formation in any of the manners discussed herein. Some embodiments may also include a program product including a computer readable medium and program code stored on the computer readable medium and configured upon execution by at least one processing unit to evaluate a subsurface formation in any of the manners discussed herein.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIGS. 2A-2D illustrate simplified, schematic views of an oilfield having subterranean formations containing reservoirs therein in accordance with implementations of various technologies and techniques described herein.

FIG. 7A illustrates an example fracture map, and FIGS. 7B, 7C and 7D illustrate growing the fractures in the example fracture map of FIG. 7A into rectangular, elliptical, and circular shapes, respectively.

DETAILED DESCRIPTION

The herein-described embodiments utilize a number of techniques to evaluate fracture abundance in a subsurface formation, e.g., a region or volume of the Earth such as a volume potentially incorporating recoverable hydrocarbons. Fracture abundance, in particular, may be evaluated using a three-dimensional fracture network defined using a plurality of geometric primitives such as triangular elements disposed within a three-dimensional volume, and the evaluation of fracture abundance may result in the generation of one or more fracture abundance parameters for the subsurface formation. A fracture abundance parameter, within the context of the invention, may be any parameter that is indicative of the abundance or amount of fracturing in a subsurface volume, e.g., based on fracture intensity, fracture density, fracture porosity, etc. In some embodiments, a fracture abundance parameter may be based, for example, on ratios between different dimensional values, e.g., various $P_{XY}$ values, where x is the dimension of the measured value or feature and y is the dimension of the sampling region. In the embodiments discussed below, for example, a fracture abundance parameter may be a $P_{32}$ value of fracture density, based on the sum of the areas of fractures in a unit volume such as a grid cell. As other measurements or parameters may be used to represent relative amounts of fracturing in a subsurface volume, however, the invention is not limited to $P_{32}$ fracture density values.

Other variations and modifications will be apparent to one of ordinary skill in the art.

Hardware and Software Environment

Figure 1:
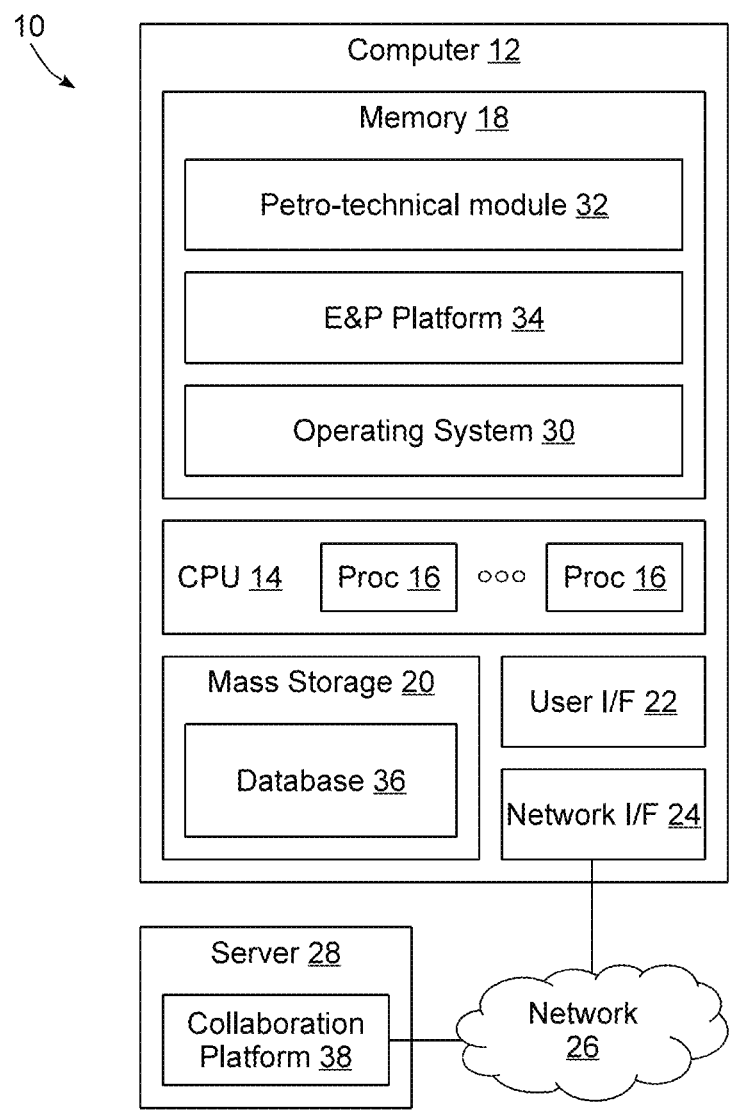
FIG. 1 is a block diagram of an example hardware and software environment for a data processing system in accordance with implementation of various technologies and techniques described herein.

Turning now to the drawings, wherein like numbers denote like parts throughout the several views, FIG. 1 illustrates an example data processing system 10 in which the various technologies and techniques described herein may be implemented. System 10 is illustrated as including one or more computers 12, e.g., client computers, each including a central processing unit (CPU) 14 including at least one hardware-based processor or processing core 16. CPU 14 is coupled to a memory 18, which may represent the random access memory (RAM) devices comprising the main storage of a computer 12, as well as any supplemental levels of memory, e.g., cache memories, non-volatile or backup memories (e.g., programmable or flash memories), read-only memories, etc. In addition, memory 18 may be considered to include memory storage physically located elsewhere in a computer 12, e.g., any cache memory in a microprocessor or processing core, as well as any storage capacity used as a virtual memory, e.g., as stored on a mass storage device 20 or on another computer coupled to a computer 12.

Each computer 12 also generally receives a number of inputs and outputs for communicating information externally. For interface with a user or operator, a computer 12 generally includes a user interface 22 incorporating one or more user input/output devices, e.g., a keyboard, a pointing device, a display, a printer, etc. Otherwise, user input may be received, e.g., over a network interface 24 coupled to a network 26, from one or more external computers, e.g., one or more servers 28 or other computers 12. A computer 12 also may be in communication with one or more mass storage devices 20, which may be, for example, internal hard disk storage devices, external hard disk storage devices, storage area network devices, etc.

A computer 12 generally operates under the control of an operating system 30 and executes or otherwise relies upon various computer software applications, components, programs, objects, modules, data structures, etc. For example, a petro-technical module or component 32 executing within an exploration and production (E&P) platform 34 may be used to access, process, generate, modify or otherwise utilize petro-technical data, e.g., as stored locally in a database 36 and/or accessible remotely from a collaboration platform 38. Collaboration platform 38 may be implemented using multiple servers 28 in some implementations, and it will be appreciated that each server 28 may incorporate a CPU, memory, and other hardware components similar to a computer 12.

In one non-limiting embodiment, for example, E&P platform 34 may implemented as the PETREL Exploration & Production (E&P) software platform, while collaboration platform 38 may be implemented as the STUDIO E&P KNOWLEDGE ENVIRONMENT platform, both of which are available from Schlumberger Ltd. and its affiliates. It will be appreciated, however, that the techniques discussed herein may be utilized in connection with other platforms and environments, so the invention is not limited to the particular software platforms and environments discussed herein.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code generally comprises one or more instructions that are resident at various times in various memory and storage devices in a computer, and that, when read and executed by one or more hardware-based processing units in a computer (e.g., microprocessors, processing cores, or other hardware-based circuit logic), cause that computer to perform the steps embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Furthermore, it will be appreciated by those of ordinary skill in the art having the benefit of the instant disclosure that the various operations described herein that may be performed by any program code, or performed in any routines, workflows, or the like, may be combined, split, reordered, omitted, and/or supplemented with other techniques known in the art, and therefore, the invention is not limited to the particular sequences of operations described herein.

Those skilled in the art will recognize that the example environment illustrated in FIG. 1 is not intended to limit the invention. Indeed, those skilled in the art will recognize that other alternative hardware and/or software environments may be used without departing from the scope of the invention.

Oilfield Operations

FIGS. 2A-2D illustrate simplified, schematic views of an oilfield 100 having subterranean formation 102 containing reservoir 104 therein in accordance with implementations of various technologies and techniques described herein. FIG. 2A illustrates a survey operation being performed by a survey tool, such as seismic truck 106.1, to measure properties of the subterranean formation. The survey operation is a seismic survey operation for producing sound vibrations. In FIG. 2A, one such sound vibration, sound vibration 112 generated by source 110, reflects off horizons 114 in earth formation 116. A set of sound vibrations is received by sensors, such as geophone-receivers 118, situated on the earth's surface. The data received 120 is provided as input data to a computer 122.1 of a seismic truck 106.1, and responsive to the input data, computer 122.1 generates seismic data output 124. This seismic data output may be stored, transmitted or further processed as desired, for example, by data reduction.

FIG. 2B illustrates a drilling operation being performed by drilling tools 106.2 suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud may be filtered and returned to the mud pit.

A circulating system may be used for storing, controlling, or filtering the flowing drilling muds. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produces data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106.2 may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Generally, the wellbore is drilled according to a drilling plan that is established prior to drilling. The drilling plan sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also need adjustment as new information is collected The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize portions of the field operation, such as controlling drilling, weight on bit, pump rates, or other parameters. These adjustments may be made automatically based on computer protocol, and/or manually by an operator. In some cases, well plans may be adjusted to select optimum operating conditions, or to avoid problems.

FIG. 2C illustrates a wireline operation being performed by wireline tool 106.3 suspended by rig 128 and into wellbore 136 of FIG. 2B. Wireline tool 106.3 is adapted for deployment into wellbore 136 for generating well logs, performing downhole tests and/or collecting samples. Wireline tool 106.3 may be used to provide another method and apparatus for performing a seismic survey operation. Wireline tool 106.3 may, for example, have an explosive, radioactive, electrical, or acoustic energy source 144 that sends and/or receives electrical signals to surrounding subterranean formations 102 and fluids therein.

Wireline tool 106.3 may be operatively connected to, for example, geophones 118 and a computer 122.1 of a seismic truck 106.1 of FIG. 2A. Wireline tool 106.3 may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106.3 to measure downhole parameters which relate to, for example porosity, permeability, fluid composition and/or other parameters of the field operation.

FIG. 2D illustrates a production operation being performed by production tool 106.4 deployed from a production unit or Christmas tree 129 and into completed wellbore 136 for drawing fluid from the downhole reservoirs into surface facilities 142. The fluid flows from reservoir 104 through perforations in the casing (not shown) and into production tool 106.4 in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106.4 or associated equipment, such as christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the well sites for selectively collecting downhole fluids from the wellsite(s).

While FIGS. 2B-2D illustrate tools used to measure properties of an oilfield, it will be appreciated that the tools may be used in connection with non-oilfield operations, such as gas fields, mines, aquifers, storage, or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 2A-2D are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites.

Figure 3:
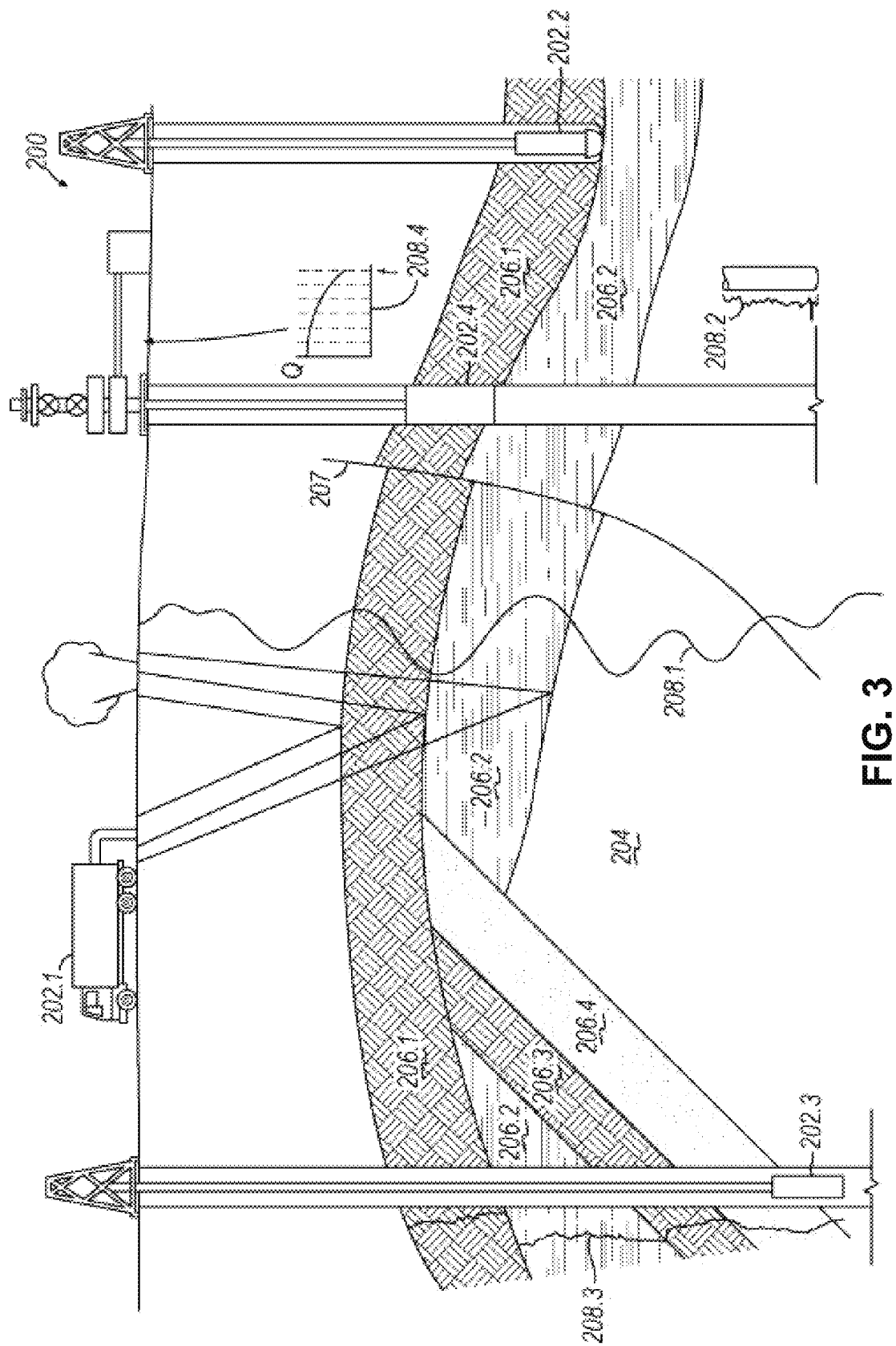
FIG. 3 illustrates a schematic view, partially in cross section of an oilfield having a plurality of data acquisition tools positioned at various locations along the oilfield for collecting data from the subterranean formations in accordance with implementations of various technologies and techniques described herein.

FIG. 3 illustrates a schematic view, partially in cross section of oilfield 200 having data acquisition tools 202.1, 202.2, 202.3 and 202.4 positioned at various locations along oilfield 200 for collecting data of subterranean formation 204 in accordance with implementations of various technologies and techniques described herein. Data acquisition tools 202.1-202.4 may be the same as data acquisition tools 106.1-106.4 of FIGS. 2A-2D, respectively, or others not depicted. As shown, data acquisition tools 202.1-202.4 generate data plots or measurements 208.1-208.4, respectively. These data plots are depicted along oilfield 200 to demonstrate the data generated by the various operations.

Data plots 208.1-208.3 are examples of static data plots that may be generated by data acquisition tools 202.1-202.3, respectively, however, it should be understood that data plots 208.1-208.3 may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208.1 is a seismic two-way response over a period of time. Static plot 208.2 is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208.3 is a logging trace that generally provides a resistivity or other measurement of the formation at various depths.

A production decline curve or graph 208.4 is a dynamic data plot of the fluid flow rate over time. The production decline curve generally provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206.1-206.4. As shown, this structure has several formations or layers, including a shale layer 206.1, a carbonate layer 206.2, a shale layer 206.3 and a sand layer 206.4. A fault 207 extends through the shale layer 206.1 and the carbonate layer 206.2. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, generally below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 3, may then be processed and/or evaluated. Generally, seismic data displayed in static data plot 208.1 from data acquisition tool 202.1 is used by a geophysicist to determine characteristics of the subterranean formations and features. The core data shown in static plot 208.2 and/or log data from well log 208.3 are generally used by a geologist to determine various characteristics of the subterranean formation. The production data from graph 208.4 is generally used by the reservoir engineer to determine fluid flow reservoir characteristics. The data analyzed by the geologist, geophysicist and the reservoir engineer may be analyzed using modeling techniques.

Figure 4:
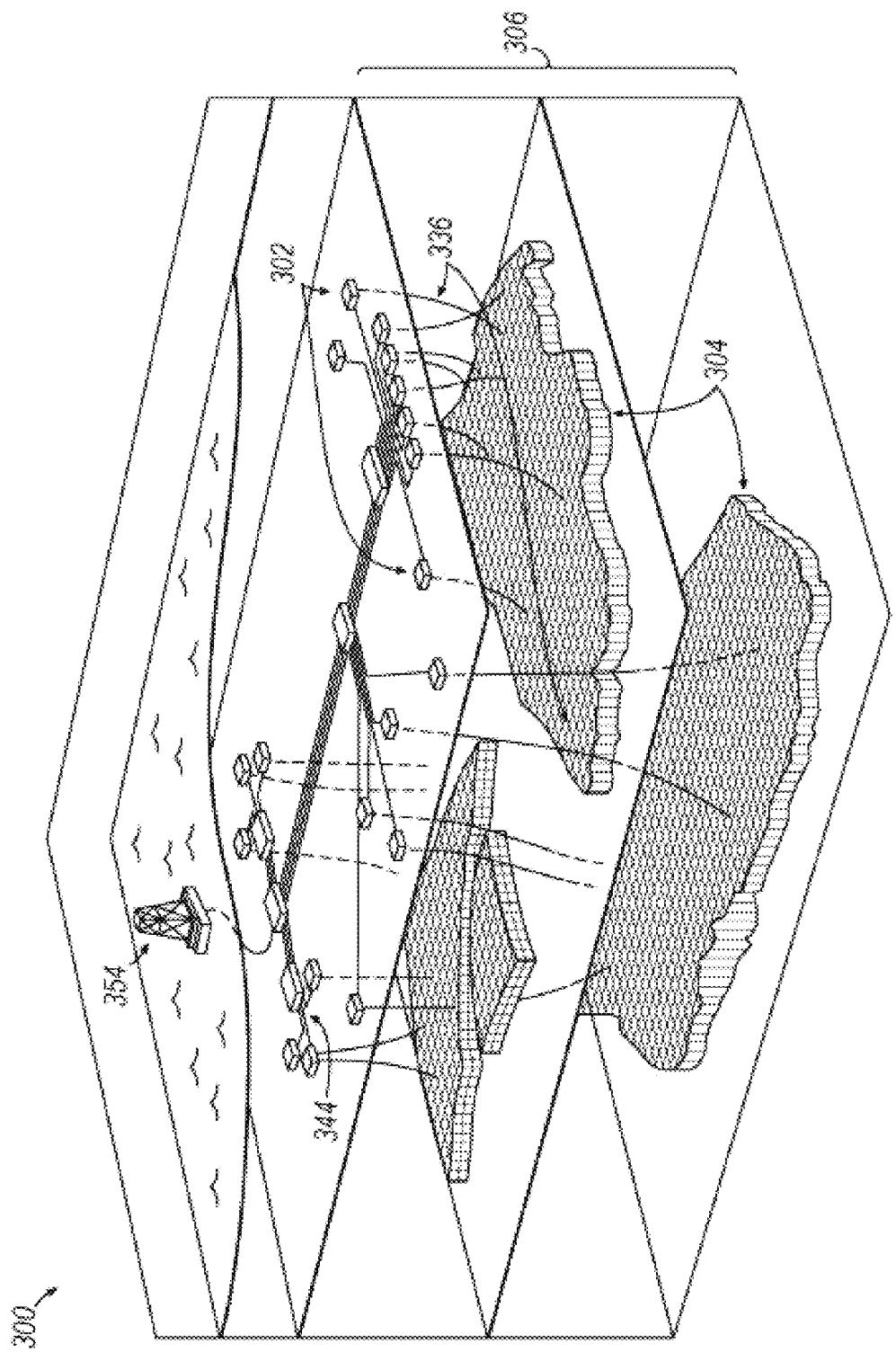
FIG. 4 illustrates a production system for performing one or more oilfield operations in accordance with implementations of various technologies and techniques described herein.

FIG. 4 illustrates an oilfield 300 for performing production operations in accordance with implementations of various technologies and techniques described herein. As shown, the oilfield has a plurality of wellsites 302 operatively connected to central processing facility 354. The oilfield configuration of FIG. 4 is not intended to limit the scope of the oilfield application system. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

Three-Dimensional Fracture Abundance Evaluation

As noted above, evaluation of fracture abundance parameters such as $P_{32}$ fracture density may be limited in conventional approaches due in part to difficulties associated with accurately accounting for fracture sizes from borehole or other formation data. Embodiments consistent with the invention, on the other hand, may utilize a three-dimensional approach incorporating various features that facilitate evaluation of fracture abundance in a subsurface formation in a more computationally efficient and accurate manner than such approaches.

Embodiments consistent with the invention, in particular, may be based in part upon a determination of the areas of geometric primitives that are used to represent a fracture network within a three-dimensional volume, e.g., within a three-dimensional model of a subsurface formation. The geometric primitives may be implemented, for example, as two-dimensional triangles defined by collections of three points in the three-dimensional volume, although other two-dimensional shapes may be used as geometric primitives in other embodiments of the invention. The areas furthermore may be determined on a subvolume-by-subvolume basis, e.g., with primitives that fall entirely within a subvolume having areas corresponding to the areas of the entire primitives, and with primitives that fall partially within a subvolume being clipped at the boundaries of the subvolume such that the areas are of the clipped portions of the primitives. In some embodiments, for example, a fracture network may be overlaid into a regular grid of cubic cells, and as such, areas of primitives representing a fracture network may be determined on a cell-by-cell basis.

In the illustrated embodiments discussed hereinafter, the areas of each of the primitives (or clipped portions thereof) within each cell may be summed, and then a ratio may be taken against the volume of each cell to generate a "real" $P_{32}$ fracture density for each cell. In contrast with many conventional approaches, the $P_{32}$ fracture density may be a more directly-calculated or "true" value rather than an inferred and interpolated value, and may be used to better constrain and validate a fracture network and/or to define correction factors to correct any relative $P_{32}$ values inferred from a borehole and/or interpolated in a 3D grid. As noted above, however, the techniques described herein may be used to calculate other fracture abundance parameters, so the invention is not limited to the particular fracture density calculations discussed herein.

Figure 5:
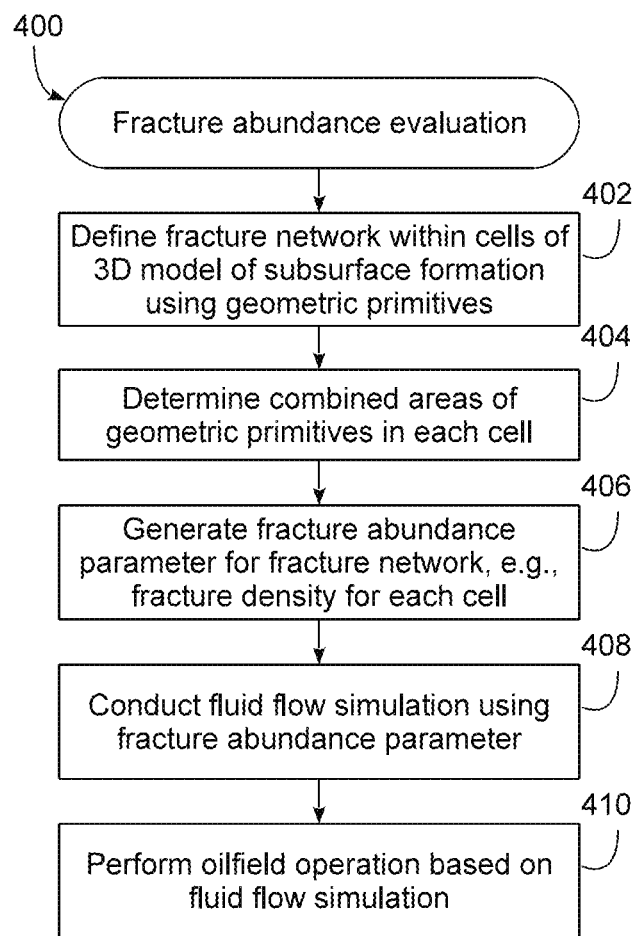
FIG. 5 is a flowchart illustrating an example sequence of operations for performing fracture abundance evaluation in the data processing system of FIG. 1.

FIG. 5, for example, illustrates a sequence of operations 400 capable of being implemented in data processing system 10 to evaluate fracture abundance within a subsurface formation. In block 402, a fracture network may be defined within the cells of a three-dimensional model using a plurality of geometric primitives. As will become more apparent below, in some embodiments, a fracture network may be generated in part from outcrop and/or seismic data, which may be used to generate two-dimensional (2D) polylines. In addition, in some embodiments, the fracture network may be generated by growing or expanding the 2D polylines in one or more directions and representing the resulting shapes using geometric primitives, with all polylines grown in the same direction (e.g., horizontally or vertically), or with different polylines grown in different directions. In other embodiments, a fracture network may be generated manually (e.g., through a computer interface) and/or based on collected data (e.g., from geomechanical properties).

A polyline, in this regard, may refer to a line comprised of one or more line segments, and a two-dimensional polyline is a polyline comprised of one or more line segments that lie within the same plane. Thus, it will be appreciated that while the polylines are referred to as two-dimensional polylines, such polylines may still be one-dimensional entities in some instances, e.g., where such polylines include only one line segment or where the segments of such polylines extend along the same axis. It will also be appreciated that in some embodiments, the line segments of a polyline need not lie in the same plane.

Next, in block 404, the combined areas of the geometric primitives within at least a subset of the cells of the 3D model are determined by summing together the areas of individual geometric primitives within each of the cells. Then, in block 406, a fracture abundance parameter is generated for the fracture network. For example, in some embodiments, the fracture abundance parameter may include a fracture density such as a $P_{32}$ value for one or more cells in the 3D model. In other embodiments, other values indicative of fracture abundance may be generated from the determined combined areas.

The fracture abundance parameter may then be used for various purposes in various embodiments of the invention. For example, as illustrated in block 408, the fracture abundance parameter may be used in fluid flow simulation using the same or a different 3D model of the subsurface formation. Further, as illustrated in block 410, the results of the fluid flow simulation may be used to perform various oilfield operations, e.g., drilling a production and/or injection well, developing a well plan, determining a well trajectory, managing production, mine planning, civil engineering (e.g.: slope stability, tunneling), geotechnical ground control applications, etc. In addition, a directly-calculated fracture abundance parameter such as the directly-calculated $P_{32}$ value described herein may be used in some embodiments to better constrain and validate a fracture network and/or define correction factors to correct a relative $P_{32}$ value inferred from borehole data and interpolated in a 3D grid.

It will also be appreciated that the information generated during the various operations described above may also be visualized, e.g., within a graphical tool provided in an E&P platform, including both visualization of a generated fracture network as well as visualization of fracture abundance parameters calculated therefor. Further, it will be appreciated that the various operations may be performed by different tools, and that the operations need not be performed by or within a single tool.

Figure 6:
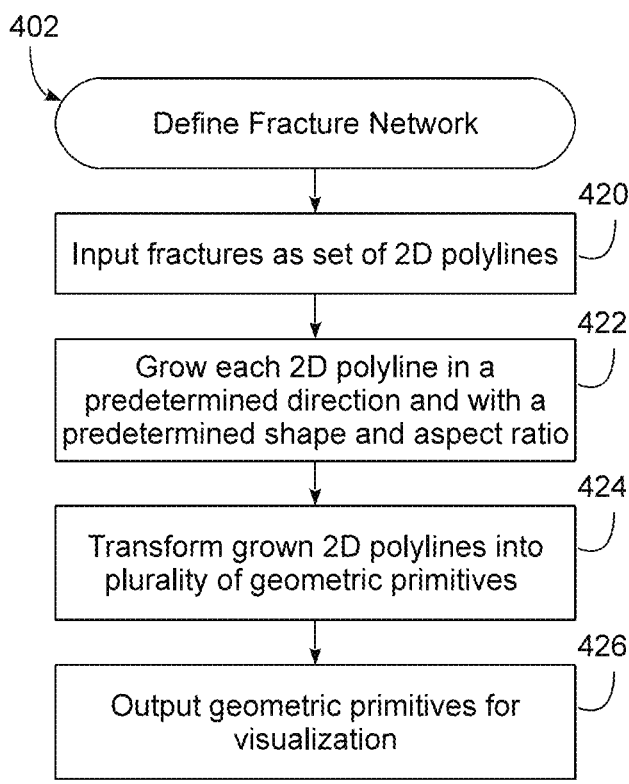
FIG. 6 is a flowchart illustrating an example sequence of operations for defining a fracture network in the data processing system of FIG. 1.

Now turning to FIG. 6, as noted above a fracture network may be defined in block 402 of FIG. 5 in various manners in different embodiments. FIG. 6, for example, illustrates a sequence of operations that "grows" or expands three-dimensional fractures from two-dimensional polylines and represents those three-dimensional fractures using one or more geometric primitives. In particular, in block 420 fractures are input as a set of two-dimensional polylines, i.e., lines defined by two distinct points and thus having a length along an axis extending between those points. The polylines may be generated, for example, from seismic data, from outcropping data, from borehole images, and, as discussed in greater detail below, from geomechanical data, among other sources. In some embodiments, for example, the 2D polylines may be defined within a common plane such as a two-dimensional map representing a planar slice taken through the subsurface formation, although the invention is not so limited.

Next, in block 422, each 2D polyline is grown or expanded in a predetermined direction and with a predetermined shape and aspect ratio, i.e., a ratio that controls the amount of growth in the predetermined direction relative to the length of a polyline. The predetermined shape may be selected from different potential shapes capable of representing a fracture. In the illustrated embodiment, for example, the shape may be rectangular or elliptical, although the invention is not so constrained. Rectangular shapes may be favored for performance reasons, while elliptical shapes may be favored for accuracy as many fractures have a profile more closely matching that of an ellipse.

It will be appreciated that in some embodiments, expanding or growing a polyline along a predetermined direction may be considered to include expanding or growing the polyline in two opposite directions, e.g., equidistant from the polyline, or in some instances, different distances from the polyline. Further, expanding or growing a polyline along a predetermined direction generally results in the polyline being expanded within a plane that contains the polyline, referred to herein as a containing plane for the polyline.

In different embodiments, a single direction, shape and aspect ratio may be used to grow all polylines, while in other embodiments the direction, shape and/or aspect ratio may be varied for different polylines. Furthermore, the direction, shape and/or aspect ratio may be manually input by a user in some embodiments, while in other embodiments, one or more of these inputs may be determined programmatically. In some embodiments, for example, an optimizer may apply different inputs to generate different three-dimensional fracture networks that may each be used to determine different fracture abundance parameters, and these different parameters may be used in fluid flow simulations and matched against collected data to determine the combination of inputs that best matches observed data. In addition, it may even be desirable to utilize a randomized approach to generate directions, shapes and/or aspect ratios for different polylines. As such, it will also be appreciated that the respective containing planes of different polylines may in some embodiments extend in a same direction or different directions relative to a common plane within which the polylines are disposed, and further, in some embodiments, the respective containing planes may be substantially orthogonal to such a common plane, e.g., being substantially vertical relative to a substantially horizontal common plane.

Next, in block 424, each grown 2D polyline may be transformed into a plurality of geometric primitives, e.g., triangles, to represent the grown shape. Then in block 426, the geometric primitives may optionally be output for visualization or other purposes. For example, in one embodiment, the geometric primitives may be output in a TSURF file format for import and display in the PETREL E&P platform.

With further reference to FIGS. 7A-7D further illustrate the transformation of 2D polylines into 3D sets of geometric primitives, and in the case where the 2D polylines are provided in the form of a horizontal digitized fracture map such as may be generated from seismic or outcrop data, and grown in a vertical direction. FIG. 7A, in particular, illustrates a fracture map 430 including a pair of intersecting 2D polylines 432. FIGS. 7B, 7C and 7D respectively illustrate the transformation of polylines 432 into rectangular, elliptical and circular shapes, respectively.

As illustrated in FIG. 7B, for example, polylines 432 may be grown into rectangular shapes 440, each formed from four points or nodes 442 and two triangles 444. Likewise, as illustrated in FIG. 7C, polylines 432 may alternately be grown into elliptical shapes 450, each formed from 13 points or nodes 452 and 12 triangles 454. FIG. 7D also illustrates circular shapes 460, which are a special case of elliptical shapes where the radius An (semi-axis longest of an ellipse) and Bn (semi-axis shortest of an ellipse) are equal. However, fracture growth is not limited to a certain number of nodes and triangles although higher numbers of nodes and triangles may lead to greater computational resource requirements and/or computation times.

As noted above, the amount of growth may be constrained by an aspect ratio, and as such, The starting and ending points of a 2D polyline and the segment length may be used to expand a fracture according to an aspect ratio (Asp) as follows:

$$bn = an \times Asp$$

where an is the fracture length divided per two and Asp is the input aspect ratio.

Now returning briefly to blocks 404-406 of FIG. 5, once a fracture network is defined, a fracture abundance parameter may be calculated for a fracture network in a number of different manners consistent with the invention. Further, in some embodiments, a 3D observation grid may be generated after defining a fracture network based upon the minimum and maximum longitude/latitude and depth of the fracture network, and using a selected unit cell size to provide the desired resolution for fracture abundance parameter calculations.

Figure 8:
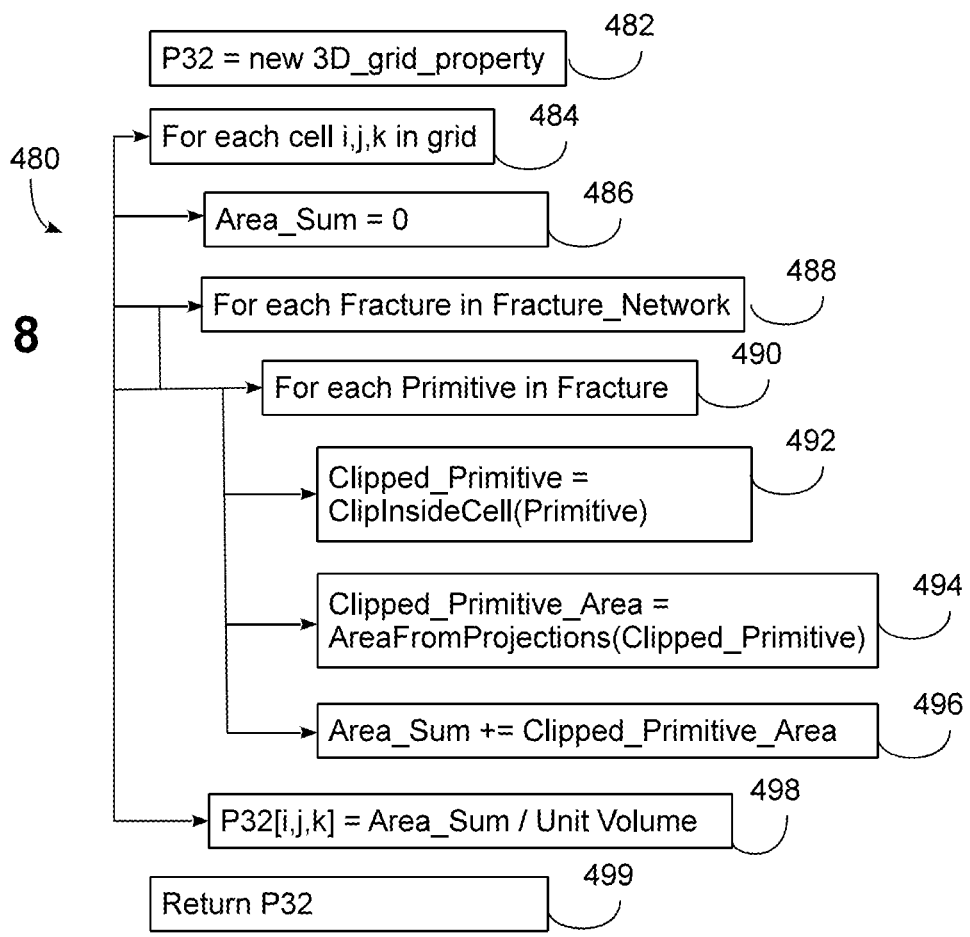
FIG. 8 is a flowchart illustrating an example sequence of operations for determining a $P_{32}$ value a fracture network in the data processing system of FIG. 1.

FIG. 8 next illustrates an example sequence of operations 480 suitable for implementing blocks 404 and 406. In these examples, it assumed that the fracture network is derived from 2D polylines in a horizontal fracture map and grown in a vertical direction, and that the fracture abundance parameter calculated is a $P_{32}$ fracture density value for each cell within an observation grid.

The calculation of $P_{32}$ in the 3D grid may in some embodiments be performed by column along the vertical Z-axis, and in some embodiments, may organize or store geometric primitives from the fracture network in an octree or other spatially-organized data structure to optimize calculations. Sequence of operations 480 begins in block 482 by creating a new 3D grid property for a $P_{32}$ value. For each cell i,j,k (block 484), an Area_Sum variable is initialized to zero (block 486). Next, for each fracture in the fracture network (block 488) and for each geometric primitive in the fracture (block 490), the sequence may call is ClipInsideCell function (block 492) to create a clipped primitive including only that portion of the primitive that is inside the current cell. Block 494 then calls an AreaFromProjections function (discussed in greater detail below) on the clipped primitive to calculate the area of the primitive, and the result of this function is added to the Area_Sum variable (block 496). This process is then repeated for every primitive in every fracture, resulting in Area_Sum storing the combined areas of the fractures within the cell. As such, block 498 divides Area_Sum by the Unit Volume of the cell, resulting in the determination of the $P_{32}$ value for that cell. Each cell in the grid is thereafter processed in a similar manner, and the result is returned in block 499 as a 3D matrix of $P_{32}$ values.

Figure 9:
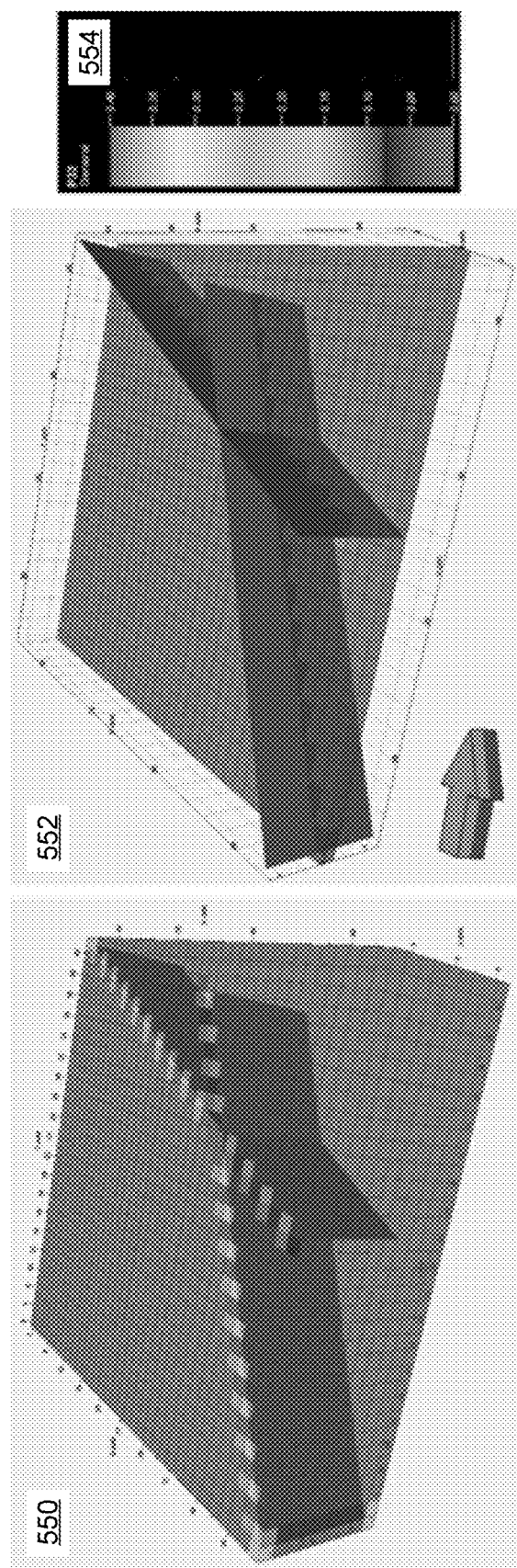
FIG. 9 illustrates three-dimensional views of a full grid and a horizontal layer through a grid with a fracture abundance parameter displayed therein.

In addition, as noted above, a generated fracture abundance parameter may be used for visualization, among other purposes. FIG. 9, for example, illustrates two visualizations 550, 552 of a 3D volume or grid used to calculate a $P_{32}$ fracture density value for the 2D polylines 432 illustrated in FIG. 7A and grown into rectangular shapes as illustrated in FIG. 7B. In visualization 550, the distribution of the $P_{32}$ fracture density parameter throughout the full grid is illustrated, while in visualization 552, the distribution is limited to a horizontal layer through the grid. Shadings or colors (mapped in legend 554) denote the varying values of the $P_{32}$ parameter.

Figure 10:
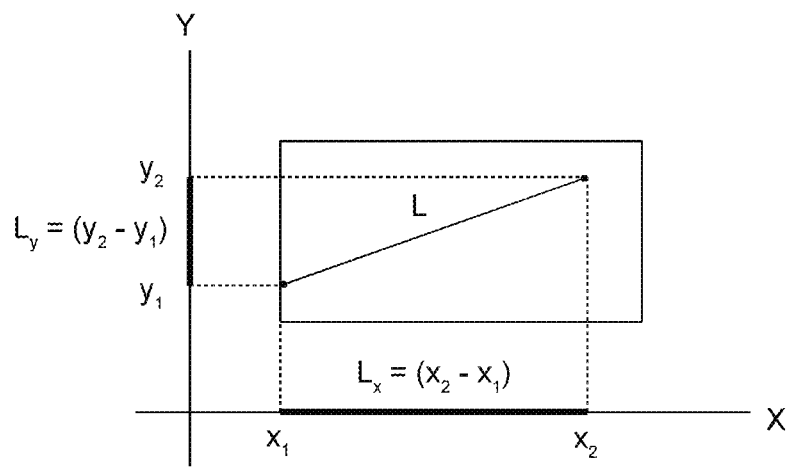
FIG. 10 illustrates calculating a length of a line in a two-dimensional space using projection.
Figure 11:
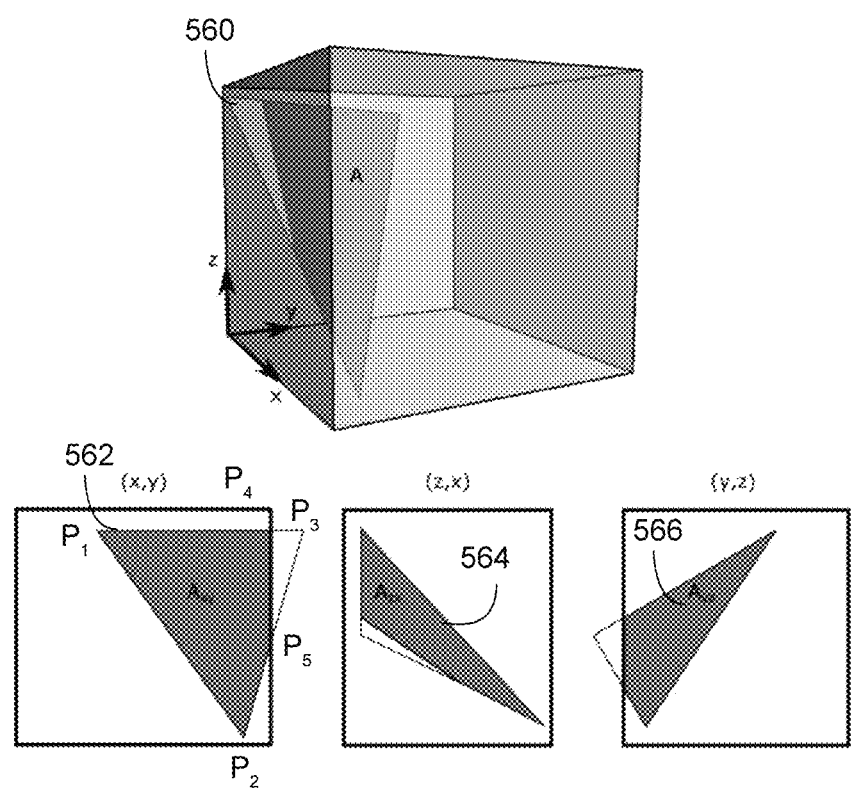
FIG. 11 illustrates calculating an area of a primitive in a cell using projection.
Figure 12:
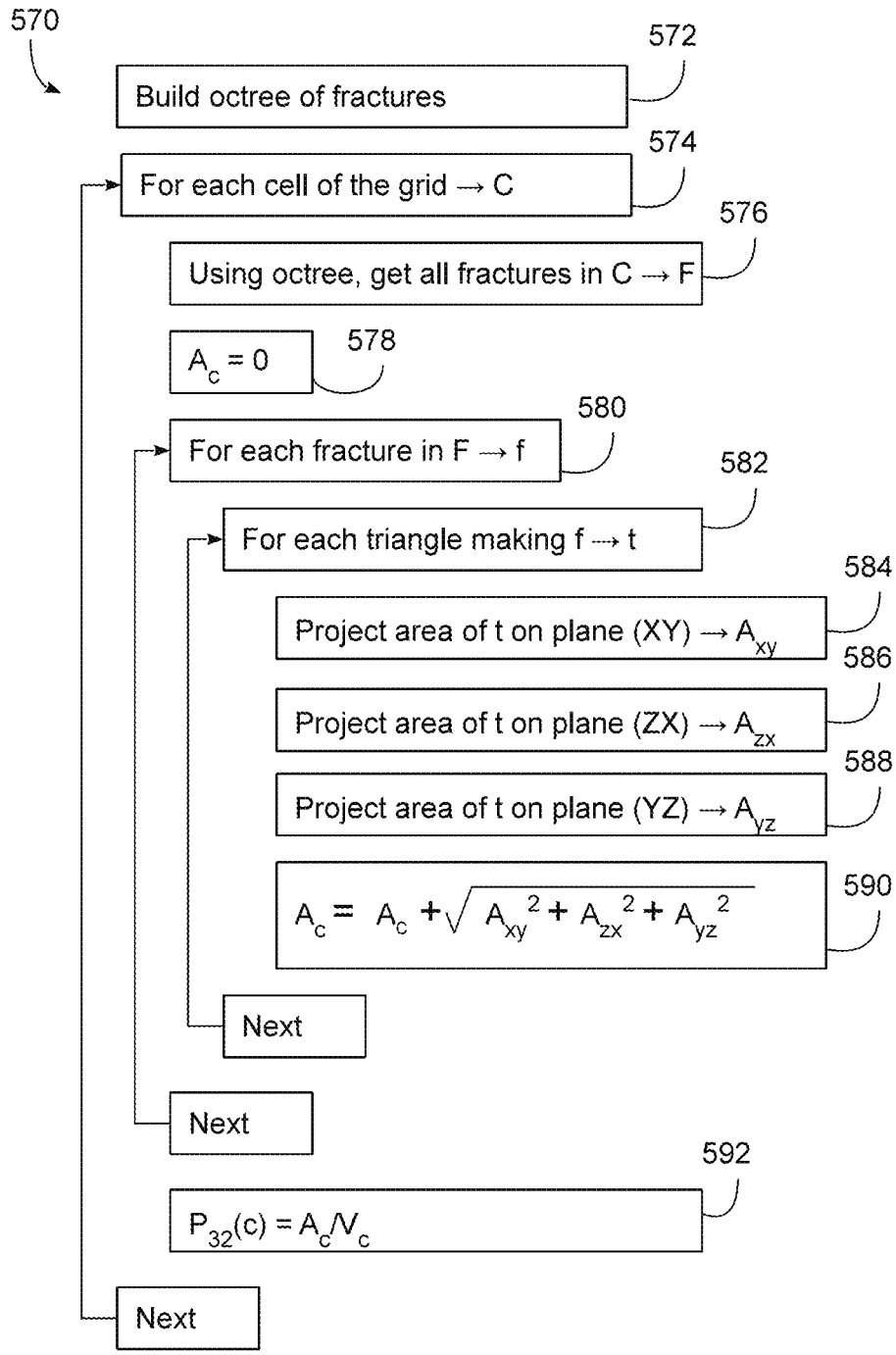
FIG. 12 is a flowchart illustrating an example sequence of operations for determining a $P_{32}$ value using geometric primitive projection in the data processing system of FIG. 1.

Now turning to FIGS. 10-12, in some embodiments of the invention, geometric primitive projection may be used to reduce the computational resources and/or the latency associated with fracture abundance parameter determinations, e.g., to implement the AreaFromProjections function discussed above. As noted above, fracture abundance parameter determinations may be based in part on determining a combined sum of the areas of geometric primitives such as triangular elements within each cell or volume of a three-dimensional observation grid. Consequently, in many embodiments, a fundamental operation that generally consumes a significant portion of the employed computational resources is evaluating the area of a triangle in a cell, with the understanding that the triangle can cut the cell and thus project at least partially outside of the cell. Conventional approaches to area determinations may use simplified fracture geometries, e.g., usually vertical and with a rectangular shape, in order to reduce computational resources for the entire grid (which in some instances may contain millions of cells). As such, the accuracy that may otherwise be achieved using more complex and more realistic shapes to model fractures (e.g., elliptical shapes and/or shapes that project in non-vertical directions) may need to be sacrificed in order to achieve practical runtimes on moderately powerful computer systems.

Some embodiments consistent with the invention, on the other hand, may incorporate primitive projection to accelerate the determination of the area of a geometric primitive such as a triangular element inside a cell, such that the evaluation of fracture abundance may include at least the operations of defining a fracture network within a plurality of cells of a three-dimensional model of a subsurface formation using a plurality of geometric primitives, determining an area of the plurality of geometric primitives within at least a subset of the plurality of cells by summing areas of individual geometric primitives within each of the subset of cells, including determining an area of a first geometric primitive among the plurality of geometric primitives within a first cell in the subset of cells by projecting the first geometric primitive onto each of first, second and third orthogonal planes respectively aligned with faces of the first cell to define respective first, second and third projections and calculating areas of each of the first, second and third projections, and determining a fracture abundance parameter for the fracture network from the determined area of the plurality of geometric primitives. In addition to reducing computation time and/or computational resources, the herein-described technique may also in some embodiments shift the barrier to evaluate any triangular element of any orientation in a 3D Cartesian space, such that rapid calculations may be made of planar triangular elements of any orientation, and generally without involving classical heavy trigonometric algorithms to calculate the area. Further, in some embodiments the area of any subsurface structure capable of being represented by triangular elements, e.g., faults, fractures, horizons, etc., may be determined in a fast and efficient manner using the herein-described techniques, so the herein-described techniques may also be used for evaluating a subsurface formation by in part defining a subsurface structure within a plurality of cells in a three-dimensional model of the subsurface formation using a plurality of geometric primitives, determining an area of the plurality of geometric primitives using projection in the manner described herein, and determining a subsurface structure parameter for the subsurface structure (e.g., a fracture abundance parameter for a fracture network, or another parameter suitable for the particular subsurface structure being modeled) from the determined area of the plurality of geometric primitives.

Primitive projection, in this regard may be considered to refer to an operation that projects a shape of any arbitrary orientation within a three-dimensional cell onto a plane that is aligned with a face of a regular cubic cell. It will be appreciated that a face of a regular cubic cell is generally parallel to a plane formed by two of the three axes of a three-dimensional Cartesian coordinate system, e.g., where points or nodes are identified by (x, y, z) values on mutually-orthogonal X, Y and Z axes, each cell will generally have two faces parallel with each of XY, YZ and ZX planes defined by the X, Y and Z axes. Projection onto a plane aligned with a face of a regular cubic cell may therefore include projection onto a plane that is either coextensive with or parallel to a face of a cell, and thus coextensive with or parallel to the XY, YZ or ZX planes defined for a grid of regular cubic cells.

Projection may be further explained within the context of FIGS. 10-11. FIG. 10, in particular illustrates the determination of the length L of an arbitrarily oriented one-dimensional line within a two-dimensional plane through projection of the line onto the two orthogonal axes X and Y. The nodes or endpoints of the line have coordinates $(x_1, y_1)$ and $(x_2, y_2)$, and it may be seen that projecting the line onto the X and Y axes generates two projections having lengths of $L_x=(x_2-x_1)$ and $L_y=(y_2-y_1)$. Through the application of the Pythagorean theorem the length L of the line is related to the lengths of the projections by the relationship $L^2=L_x^2+L_y^2$, so the length L may be determined by taking the square root of the sum of the lengths of the projections.

FIG. 11 illustrates an extension of this principle into a three-dimensional space, where the area A of an arbitrarily oriented two-dimensional planar shape 560 within a three-dimensional volume may be determined through projection of the shape onto the three orthogonal planes XY, ZX and YZ planes to form three projections 562, 564 and 566 having areas $A_{xy}$, $A_{zx}$ and $A_{yz}$ respectively. The area A of shape 560, in particular, is related to the areas of projections 562, 564 and 566 based upon the relationship $A^2=A_{xy}^2+A_{zx}^2+A_{yz}^2$, so the area A may be determined by taking the square root of the sum of the areas of the projections.

A net effect of projecting a shape onto a plane aligned with a face of a regular cubic cell is that all points or nodes of the projection is the reduction of the 3D problem into a simple 2D problem, thus simplifying the determination of the area of a projection into a less computationally-expensive operation. The location of each point or node of a projection of a shape thus may be represented by the other two coordinates. Consequently, assuming that shape 560 is defined by three points $(x_1, y_1, z_1)$, $(x_2, y_2, z_2)$ and $(x_3, y_3, z_3)$, the projections onto the three planes XY, ZX and YZ may be considered to be defined by points:

XY projection: $(x_1, y_1)$, $(x_2, y_2)$ and $(x_3, y_3)$
ZX projection: $(z_1, x_1)$, $(z_2, x_2)$ and $(z_3, x_3)$
YZ projection: $(y_1, z_1)$, $(y_2, z_2)$ and $(y_3, z_3)$ Consequently, instead of performing complex computations to determine the area of a triangle inside a three-dimensional cell, the area may be determined by projecting the triangle onto the three principal planes and sum the squares of the resulting projected areas.

It should also be appreciated, however, that clipping may also be performed in connection with projection in order to determine the area of a primitive within a cell, generally prior to projecting the primitive. FIG. 11, for example, illustrates the clipped portions of both the primitive 560 and each projection 562-566 using darker shading than the portions that fall outside of the cell. Consequently, the coordinates of each point of the primitives may be compared with the coordinates of the boundary of the cell to replace any point disposed outside of the boundary of the cell with one or more points along the boundary of the cell. For example, as illustrated by the XY projection 562, assuming that the projection without clipping would have three points $P_1$, $P_2$ and $P_3$ and with point $P_3$ lying outside of the cell, this point may be replaced by points $P_4$ and $P_5$ to create a projected shape defined by points $P_1$, $P_2$, $P_4$ and $P_5$. In addition, while various area calculations may be used to determine the areas of clipped projections, in one embodiment the areas of clipped projections may be determined by splitting a clipped projection into a plurality of triangles and summing the areas of the triangles forming the clipped projection.

Now turning to FIG. 12, this figure illustrates an example sequence of operations 570 for performing projection-based fracture abundance parameter calculations in the manner discussed above, and in particular to determine a $P_{32}$ fracture density value for each cell in an observation grid. Sequence 570, in the illustrated embodiment, utilizes an octree or other data structure to spatially organize geometric primitives, here triangles, of a defined fracture network, and thereby facilitate lookup of the triangles that are within each cell. Various types of data structures and/or lookup algorithms, including algorithms based on other types of binary and/or spatially-partitioned trees, may be used in other embodiments.

Block 572 initially builds an octree of the fractures in the fracture network. Then, for each cell C of the grid (block 574), the octree is accessed to generate a set F of all fractures that at least partially intersect the cell C (block 576). A combined area variable $A_C$ is then reset (block 578), and each fracture fin set F (block 580), and each triangle t defining fracture f (block 582) is processed by projecting the area of the triangle t onto planes XY, ZX and YZ (block 584, 586 and 588), with the areas of the projections stored in $A_{xy}$, $A_{zx}$ and $A_{yz}$ respectively. The areas are then summed and a square root is taken of the sum, with the result added to the combined area variable $A_C$ (block 590). Then, for each cell C, the combined area variable $A_C$ is divided by the unit volume of the cell $V_C$ to generate the $P_{32}$ fracture density value for the cell (block 592). As a result of sequence 570, therefore, a $P_{32}$ fracture density value is generated for each cell of the grid.

Figure 13:
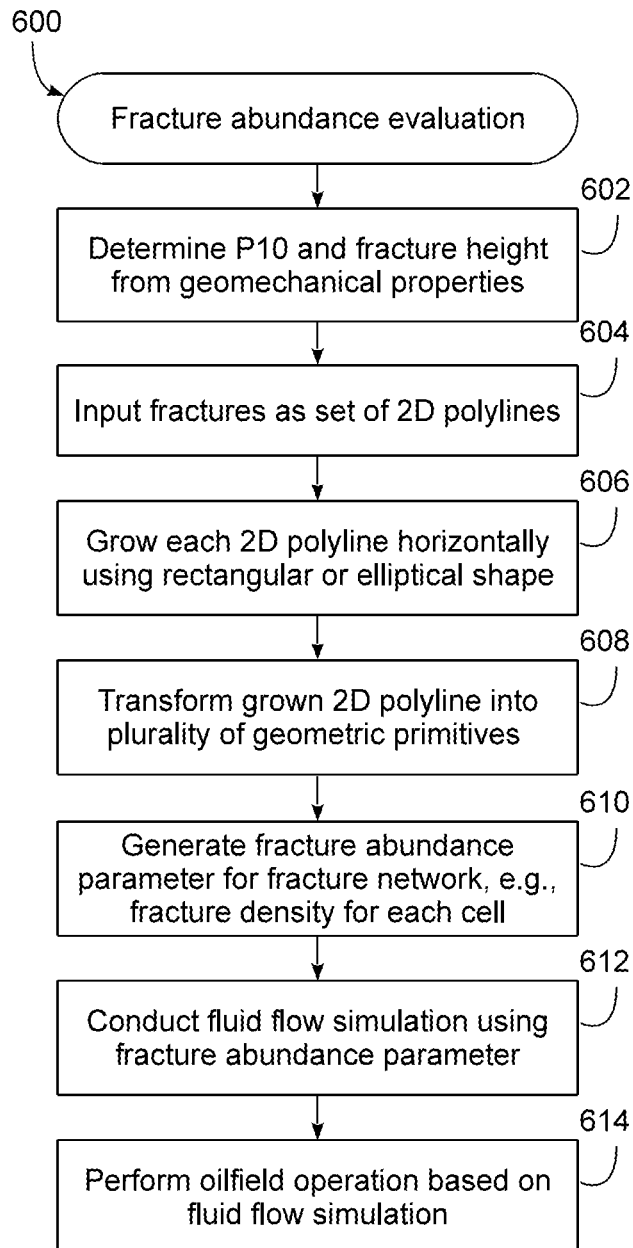
FIG. 13 is a flowchart illustrating an example sequence of operations for performing fracture abundance evaluation in the data processing system of FIG. 1, and based in part upon geomechanical simulation of mechanical properties.

Now turning to FIG. 13, in some embodiments fracture abundance evaluation may be based at least in part on geomechanical simulation based on mechanical properties of a subsurface formation. For example, using an engine such as the FAULT MODELER engine available from Schlumberger Ltd. and its affiliates, fracture density and/or fracture height may be estimated from geomechanical simulation using mechanical properties of a subsurface formation, e.g., as collected from well logging. For example, a balance energy operation may be used to estimate a $P_{10}$ fracture density and fracture height from well log data in some embodiments.

FIG. 13, in particular, illustrates an example sequence of operations 600 for evaluating fracture abundance based on geomechanical simulation based on mechanical properties. First, in block 602, a $P_{10}$ fracture density and fracture height for a subsurface formation may be determined from mechanical properties derived from well log data, e.g., one or more of Young's modulus, Poisson's ratio, friction coefficient, cohesion, fault dip, effective vertical stress, fluid pressure, and crack surface energy, among others. Such calculations may be based on a balance energy approach, and may be performed, for example, using geomechanical simulation functionality available in the PETREL, TECHLOG or FAULT MODELER software available from Schlumberger and its affiliates, although it will be appreciated that the invention is not limited to use with such software.

Based upon the results of block 602, an input file may be created including 2D polyline representations of fractures associated with fracture height, and taken along a vertical trace corresponding to the well from which the geomechanical properties were obtained that extends along the well (block 604), and then each 2D polyline may be grown in a similar manner to that described above in connection with FIG. 6, but with the direction of growth being horizontal for a vertical well (block 606). An aspect ratio may also be used to control the growth, and various shapes, including rectangular or elliptical shapes. Again similar to FIG. 6, the grown shapes may be transformed into geometric primitives (block 608), and then similar to FIG. 5, a fracture abundance parameter for the fracture network, e.g., a $P_{32}$ fracture density value for each cell, may be determined (block 610). Fluid flow simulation (block 612) and/or an oilfield operation (block 614) may then be performed, again similar to FIG. 5.

Figure 14:
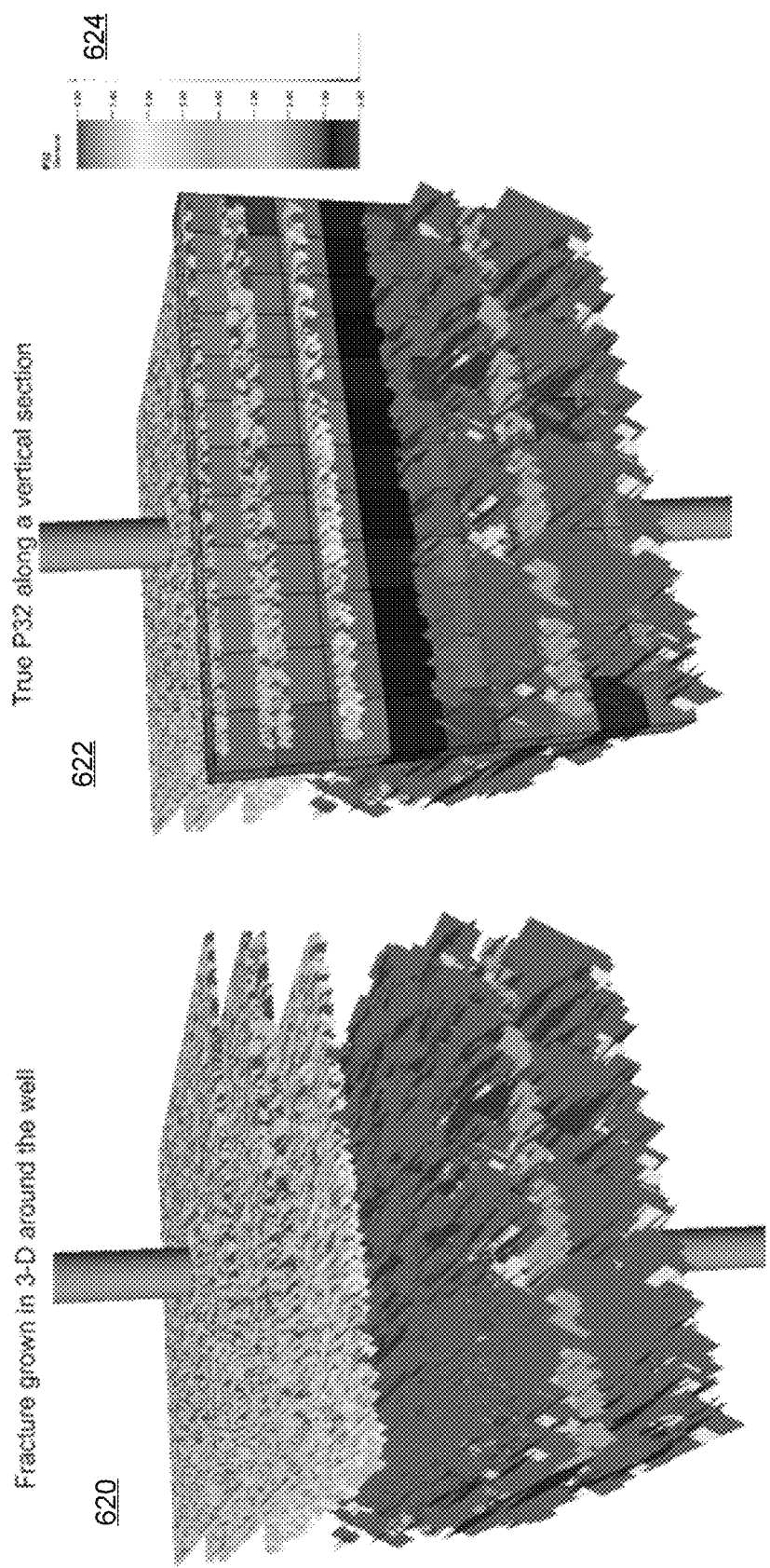
FIG. 14 illustrates three-dimensional views of a three-dimensional fracture network grown from a balance energy operation, and a vertical section including a directly-calculated $P_{32}$.

In addition, visualization may be also be performed after various operations from FIG. 13. For example, FIG. 14 illustrates a visualization 620 of fracture growth around an example well based upon geomechanical properties, while visualization 622 illustrates a vertical section of an observation grid containing the directly-calculated "true" $P_{32}$ value, with legend 624 mapping the shading to different ranges of $P_{32}$ values.

Figure 15:
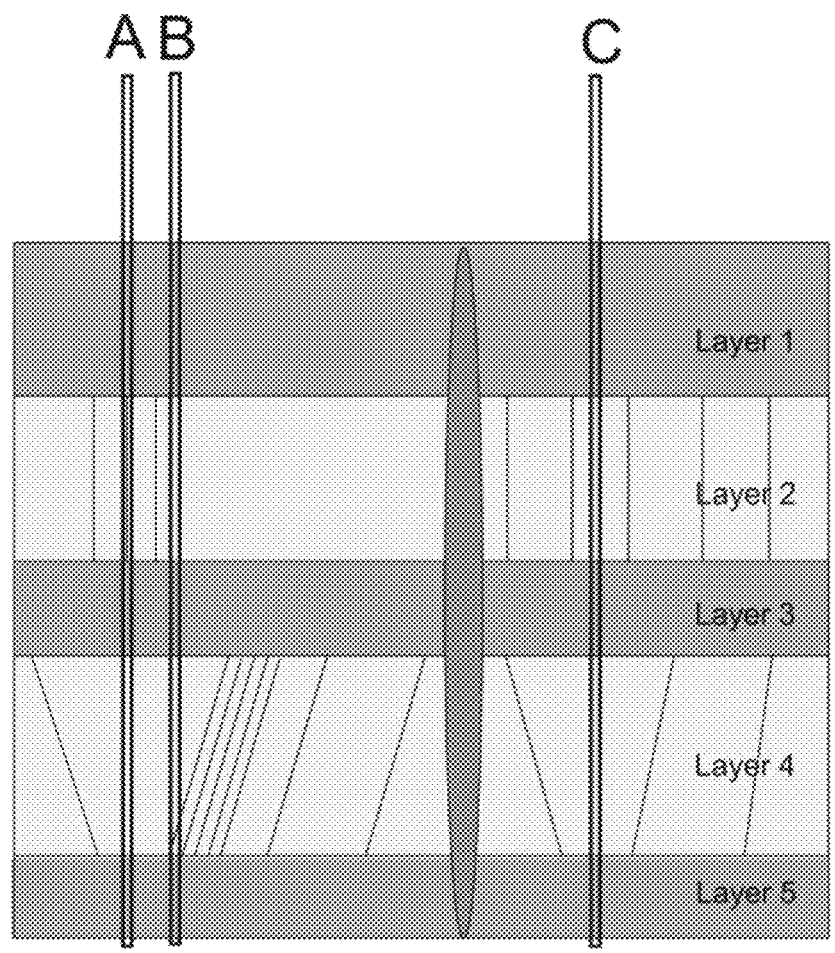
FIG. 15 functionally illustrates an example vertical cross-section through a fractured subsurface formation with multiple wells extending through the subsurface formation.

Therefore, some embodiments of the invention support the evaluation of true $P_{32}$ fracture density based on a 1D geomechanical method. By estimating the true $P_{32}$, reservoir simulations in some embodiments may be better constrained, particularly for vertical wells that may run parallel to the fracture network, and may not detect fracture at in some circumstances leading to an optimized production of the reservoir through flow simulation. In addition, in some embodiments, the results of the aforementioned evaluation may be used for other purposes, e.g., for derisking, drilling and fracture connectivity. This is particularly true in certain situations. For example, as illustrated in FIG. 15, well log data from a vertical well A may detect one fracture along layer 2 while nothing is observed in layers 3, 4 and 5. Well B may detect a fracture on layer 4, with nothing observed in in the other layers. Further, well C may not detect a fracture at all. The herein-described techniques may therefore address these situations and estimate 3D fracture abundance with better prediction along wells, which may be used to populate a 3D grid for fracture network generation instead of a direct conventional measure of fracture abundance such as a $P_{10c}$ value.

Various modifications may be made in other embodiments. For example, it will be appreciated that three-dimensional fracture abundance evaluation in some embodiments may use area determination operations other than the herein-described projection-based area determinations, as well as that projection-based area determinations may have other applications beyond that of fracture abundance evaluation. Further, as noted above, various operations may be used to generate or define a fracture network, so the invention is not limited to the particular geomechanical simulation-based approach disclosed herein, and further, other three-dimensional fracture abundance evaluation approaches beyond those described herein may be used to evaluate fracture abundance using mechanical properties.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims. In addition, while particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method of evaluating a subsurface formation, the method comprising, using at least one processing unit of a data processing system:
    defining a subsurface structure within a plurality of cells of a three-dimensional model of the subsurface formation using a plurality of geometric primitives;
    calculating a combined area of the plurality of geometric primitives within at least a subset of the plurality of cells by summing areas of individual geometric primitives within each of the subset of cells, including determining an area of a first geometric primitive among the plurality of geometric primitives within a first cell in the subset of cells by projecting the first geometric primitive onto three orthogonal XY, ZX and YZ planes respectively aligned with faces of the first cell to define respective first, second and third projections and calculating two-dimensional areas of each of the first, second and third projections, wherein the first cell is a regular cubic cell, and wherein determining the area of the first geometric primitive further includes clipping the first geometric primitive in response to determining that the first geometric primitive is partially disposed within the first cell;
    determining a subsurface structure parameter for the subsurface structure from the calculated combined area of the plurality of geometric primitives; and
    running a computer-implemented simulation for the subsurface formation or generating a visualization of at least a portion of the subsurface formation in a computer-implemented graphical tool using the determined subsurface structure parameter.

2. The method of claim 1, wherein each of the plurality of geometric primitives is a triangular element.

3. The method of claim 2, wherein determining the area of the first geometric primitive further includes squaring the areas of each of the first, second and third projections, summing the squared areas and determining a square root of the summed squared areas.

4. The method of claim 1, wherein the subsurface structure is selected from the group consisting of a fracture network, a fault and a horizon.

5. The method of claim 1, wherein defining the subsurface structure includes defining a fracture network, and wherein determining the subsurface structure parameter from the calculated combined area of the plurality of geometric primitives includes determining a fracture abundance parameter for the fracture network from the calculated combined area of the plurality of geometric primitives.

6. The method of claim 5, further comprising determining areas for one or more additional geometric primitives at least partially disposed within the first cell, wherein determining the fracture abundance parameter includes determining a fracture density within the first cell by dividing a sum of the determined areas for all geometric primitives at least partially disposed within the first cell by a volume of the first cell.

7. The method of claim 5, wherein calculating the combined area of the plurality of geometric primitives within the subset of the plurality of cells further includes:
    organizing the plurality of geometric primitives within a spatially-organized data structure stored in a memory of the data processing system; and
    accessing the spatially-organized data structure when summing areas of individual geometric primitives within each of the subset of cells to determine which of the plurality of geometric primitives are at least partially within each of the subset of cells.

8. The method of claim 7, wherein the spatially-organized data structure includes an octree.

9. The method of claim 5, wherein defining the fracture network within the plurality of cells includes:
    generating the plurality of geometric primitives; and
    creating an observation grid bounding a volume around the plurality of geometric primitives.

10. The method of claim 5, wherein determining the fracture abundance parameter includes determining a fracture density within each of the subset of cells by dividing the summed areas of individual geometric primitives therein by a volume thereof.

11. The method of claim 5, wherein determining the fracture abundance parameter includes determining a directly-calculated $P_{32}$ fracture density within each of the subset of cells by dividing the summed areas of individual geometric primitives therein by a volume thereof.

12. The method of claim 5, further comprising running a fluid flow simulation using the determined fracture abundance parameter to estimate fluid flow through the fracture network.

13. The method of claim 12, further comprising performing an oilfield operation based upon a result of the fluid flow simulation.

14. The method of claim 13, wherein performing the oilfield operation based upon a result of the fluid flow simulation includes:
    determining a well trajectory using the result of the fluid flow simulation; and
    drilling a well using the determined well trajectory.

15. The method of claim 5, further comprising generating in a computer-implemented graphical tool a visualization of at least a portion of the fracture network and of the fracture abundance parameter.

16. An apparatus, comprising:
    at least one processing unit; and
    program code configured upon execution by the at least one processing unit to evaluate a subsurface formation by:
        defining a subsurface structure within a plurality of cells of a three-dimensional model of the subsurface formation using a plurality of geometric primitives;
        calculating a combined area of the plurality of geometric primitives within at least a subset of the plurality of cells by summing areas of individual geometric primitives within each of the subset of cells, including determining an area of a first geometric primitive among the plurality of geometric primitives within a first cell in the subset of cells by projecting the first geometric primitive onto three orthogonal XY, ZX and YZ planes respectively aligned with faces of the first cell to define respective first, second and third projections and calculating two-dimensional areas of each of the first, second and third projections, wherein the first cell is a regular cubic cell, and wherein determining the area of the first geometric primitive further includes clipping the first geometric primitive in response to determining that the first geometric primitive is partially disposed within the first cell;

determining a subsurface structure parameter for the subsurface structure from the calculated combined area of the plurality of geometric primitives; and running a computer-implemented simulation for the subsurface formation or generating a visualization of at least a portion of the subsurface formation in a computer-implemented graphical tool using the determined subsurface structure parameter.

17. A program product, comprising:

a non-transitory computer readable medium; and program code stored on the computer readable medium and configured upon execution by at least one processing unit to evaluate fracture abundance in a subsurface formation by:

defining a subsurface structure within a plurality of cells of a three-dimensional model of the subsurface formation using a plurality of geometric primitives;

calculating a combined area of the plurality of geometric primitives within at least a subset of the plurality of cells by summing areas of individual geometric primitives within each of the subset of cells, including determining an area of a first geometric primitive among the plurality of geometric primitives within a first cell in the subset of cells by projecting the first geometric primitive onto three orthogonal XY, ZX and YZ planes respectively aligned with faces of the first cell to define respective first, second and third projections and calculating two-dimensional areas of each of the first, second and third projections, wherein the first cell is a regular cubic cell, and wherein determining the area of the first geometric primitive further includes clipping the first geometric primitive in response to determining that the first geometric primitive is partially disposed within the first cell;

determining a subsurface structure parameter for the subsurface structure from the calculated combined area of the plurality of geometric primitives; and running a computer-implemented simulation for the subsurface formation or generating a visualization of at least a portion of the subsurface formation in a computer-implemented graphical tool using the determined subsurface structure parameter.

* * * * *